(12) United States Patent
Watson

(10) Patent No.: US 7,345,604 B2
(45) Date of Patent: Mar. 18, 2008

(54) ANALOG TO DIGITAL CONVERSION USING RECURRENT NEURAL NETWORKS

(75) Inventor: Brian Watson, Gainesville, FL (US)

(73) Assignee: Information Systems Laboratories, Inc., San Diego, CA (US)

( * ) Notice: Subject to any disclaimer, the term of this patent is extended or adjusted under 35 U.S.C. 154(b) by 0 days.

(21) Appl. No.: 11/460,572

(22) Filed: Jul. 27, 2006

(65) Prior Publication Data

US 2008/0024345 A1   Jan. 31, 2008

(51) Int. Cl.
*H03M 1/00* (2006.01)

(52) U.S. Cl. ...................... 341/133; 341/155

(58) Field of Classification Search ................ 341/155, 341/100, 101, 133
See application file for complete search history.

(56) References Cited

U.S. PATENT DOCUMENTS

| | | | |
|---|---|---|---|
| 4,733,668 A | 3/1988 | Torrence | 137/454.6 |
| 4,781,199 A | 11/1988 | Hirama et al. | 600/437 |
| 5,229,593 A | 7/1993 | Cato | 250/205 |
| 5,315,301 A * | 5/1994 | Hosotani et al. | 341/94 |
| 5,416,627 A | 5/1995 | Wilmoth | 398/129 |
| 5,774,079 A * | 6/1998 | Zirngibl | 341/100 |
| 5,822,099 A | 10/1998 | Takamatsu | 398/162 |
| 6,141,128 A | 10/2000 | Korevaar et al. | 398/22 |
| 7,187,968 B2* | 3/2007 | Wolf et al. | 600/544 |
| 7,206,797 B2* | 4/2007 | Gressel et al. | 708/250 |

* cited by examiner

*Primary Examiner*—Peguy JeanPierre
(74) *Attorney, Agent, or Firm*—Nydegger & Associates

(57) ABSTRACT

A system for converting an analog signal into a digital data stream includes a recurrent network with a plurality of converter circuits that individually receive the same analog signal as input. The circuits then generate a plurality of spike outputs that exhibit characteristics of the analog signal. Interconnecting feedback loops from each circuit output to the input of neighboring circuits queues the plurality of spike outputs to thereby self-organize the network. A digital clock is then used to establish predetermined time intervals for counting the spike outputs to create the digital data stream.

18 Claims, 2 Drawing Sheets

ANALOG TO DIGITAL CONVERSION USING RECURRENT NEURAL NETWORKS

FIELD OF THE INVENTION

The present invention pertains generally to systems for converting analog signals into digital signals. More particularly, the present invention pertains to analog/digital (A/D) converting systems which incorporate recurrent networks that utilize self organization. The present invention is particularly, but not exclusively, useful as a system that creates a digital data stream by repetitively sampling all outputs from a relatively large number of A/D converter circuits during a sequence of relatively short predetermined time intervals.

BACKGROUND OF THE INVENTION

As is well known, digital signals can be very accurate and very precise. Moreover, they have a wide variety of potential applications. It happens, however, that many phenomena (natural and unnatural) and signals of these phenomena are initially generated in an analog format. Nevertheless, with some notable exceptions, such as certain aircraft flight instruments (e.g. a vertical speed indicator), it is often more desirable to present these signals in a digital format. If so, there are many well-known electronic analog-to-digital (A/D) converter circuits that are available for this purpose.

Although A/D converters are widely used in many applications, they are still susceptible to several notable shortcomings, e.g. limited sampling rate, signal to quantization noise ratio (resolution), and spurious free dynamic range. It is difficult to increase the sampling rate beyond the state of the art due to the limited switching rate of individual transistors and circuits. Typical attempts at increasing A/D sample rate further have employed multiplexed architectures. However, these architectures suffer from poor spurious free dynamic range due to mismatch and timing error. Thus, increased sampling rate is achieved at the expense of dynamic range.

The architecture described herein uses a plurality of 1-bit A/D converters, arranged in a recurrent neural network architecture to provide a significantly increased network-sampling rate as compared to the individual converters. Each 1-bit A/D converter integrates the voltage on its input until a threshold is reached and then outputs a voltage pulse or spike. Feedback signals coordinate the charge-fire cycles of each A/D circuit so that the overall noise in the signal baseband of the power spectrum of output spikes is suppressed. This noise shaping results in a significantly improved signal to quantization noise ratio (SQNR) as compared to oversampling alone. Mismatch, which usually plagues other ADC architectures, is not an issue since each ADC is limited to 1-bit. Accordingly, by using this method, system performance can be increased without the disadvantages of multiplexed architectures. The resulting parallel rate coded spike train is sampled by 1-bit latches and counted by a series of digital adders. The final output is a 9-bit (8-bit with sign) digital signal at a 10 GHz sample rate.

By definition, a recurrent network is one in which the network's hidden unit activations or output values are fed back into the network as inputs. In this context, it can be shown that when an output value from a first A/D converter is fed back as input to a second A/D converter in the same network, the time sequence for the charge fire cycle of the second A/D converter is altered. Through the mechanisms of a recurrent network, a plurality of A/D converters can receive a same analog signal and self-organize so their respective outputs will queue, rather than interfere (overlap) with each other.

As mentioned above, the rate at which spike outputs appear in the output of an individual A/D converter circuit is proportional to the voltage magnitude of its analog input signal. Thus, by counting the number of spike outputs for a single A/D converter, during a predetermined time interval, a spike rate can be determined that is proportional to the magnitude of an analog signal input. To get this rate may, however, be difficult, if not impossible. This is particularly so, when very high spike rates are required from a single A/D converter (i.e. rates that are caused by high voltage input from an analog signal). In this case, in order to get an accurate rate, an extended period of time for sampling the spike outputs may be required. On the other hand, consider a relatively large number of A/D converters (e.g. 2,000) that are connected in parallel (i.e. they each receive a same analog signal). They will all exhibit the same spike output rate. The difficulty here is keeping the spike outputs sufficiently separated so they can be counted within a shorter period of time.

With the above in mind, consider the incorporation of a large number of A/D converter circuits in a recurrent network. In this case, the charge fire cycles of these A/D converters will self-organize to avoid overlapping each other. Also, as indicated above, it will still happen that the single analog signal will cause each individual A/D converter to have a same output spike rate. It then follows that if all the respective spike outputs of the A/D converter circuits can be sampled over a same, shorter time interval, the collective count can be used to obtain the actual spike rate. The consequence here is that relatively long time intervals for sampling (i.e. counting) are not required. Instead, even though some A/D converters may not generate an output in the time interval, collectively, the output count will still indicate a spike output rate that is representative of the analog input. Importantly, this can be repetitively done in much shorter time intervals than would otherwise be required.

In light of the above, it is an object of the present invention to provide a system for converting an analog signal into a digital data stream which incorporates a recurrent network that will queue the respective spike outputs from, a plurality of A/D converters to create a parallel rate coded spike train that is characteristic of the analog signal. Another object of the present invention is to provide a system for converting an analog signal into a digital data stream that samples the spike outputs from a large number of A/D converters (e.g. 2,000) during a predetermined time interval (e.g. 100 picoseconds) to generate a digital stream indicative of the analog signal. Still another object of the present invention is to provide a system for converting an analog signal into a digital data stream that effectively suppresses SQNR. Another object of the present invention is to provide a system for converting an analog signal into a digital data stream that is simple to use, is relatively easy to manufacture, and is comparatively cost effective.

SUMMARY OF THE INVENTION

The present invention provides a system for converting an analog signal into a digital data stream. For this purpose, the system of the present invention includes a recurrent network for converting an analog signal into a parallel rate coded spike train. A plurality of adders are then used to convert the rate coded spike train into the digital data stream. Important aspects of the system include: 1) a plurality of converter circuits with interconnecting feedback loops that promote self-organization by the system; and 2) a digital clock that establishes a counting routine for conversion of the rate coded spike train into the digital data stream.

Structurally, the A/D converter circuits are connected to each other, in parallel. Thus, they each individually receive the same analog signal as an input. With this input, each A/D converter circuit in the system generates a spike output. As implied above, however, each converter circuit is involved with a plurality of interconnecting feedback loops. Specifically, the spike output of each converter provides a plurality of feedback pulses that are respectively sent over the plurality of feedback loops. These feedback pulses are then used as inputs to a plurality of neighboring converter circuits. It is with these connections (i.e. interconnecting feedback loops) that the system establishes a recurrent network having coordinated charge-fire cycles.

In greater detail, each converter circuit in the recurrent network is structured to have an input time constant ($T_{input}$) that will produce a firing rate for the circuit. Additionally, each converter circuit is established with a decay time constant ($T_{decay}$) that gives the recurrent network the necessary time within which to promote self-organization. To do this (i.e. self-organize), the feedback pulse is effectively a voltage decrement ($\Delta v$) that is fed from each converter circuit to a plurality of its neighboring circuits. This is done to time sequence a desired firing rate for converter circuits in the network. Thus, the decay time constant ($T_{decay}$) and the voltage decrement ($\Delta v$), together, cause the spike outputs of the individual A/D converter circuits to queue in a manner that promotes the system's self organization. The spike outputs are then counted during a predetermined time interval to determine a spike output rate. As used for the present invention, the spike output rate (i.e. spike count/predetermined time interval) is proportional to the magnitude of the analog signal in the time interval.

Preferably, when establishing the operational parameters for each converter circuit, $T_{input}$ is selected to produce a firing rate that is ten times faster than its desired firing rate, and $T_{decay}$ is selected to be approximately five hundred times greater than $T_{input}$. Further, the voltage decrement, $\Delta v$, is adjusted depending on the number of interconnecting feedback loops and the size of the recurrent network to produce the desired firing rate.

For the count of spike outputs, as indicated above, the system also includes a digital clock. Preferably, the digital clock operates at 10 GHz to establish a sequence of predetermined time intervals for sampling the spike outputs from the plurality of converter circuits. As envisioned for the present invention, each time interval is approximately one hundred picoseconds in duration and, as implied above, is continuously repeated to format the digital outputs into a rate coded spike train that is used for input to the plurality of adders.

For an overview of the operation of the system, the recurrent network first receives the analog signal. More specifically, a plurality (e.g. 2000) of analog/digital (A/D) converter circuits each receive the analog signal, in parallel. Each A/D converter circuit then generates its own spike output. Through the mechanisms of the recurrent network, the spike outputs from the various converters are queued to create a parallel rate coded spike train that exhibits characteristics indicative of the analog input. Conversion of the parallel rate coded spike train into the digital data stream is then accomplished by counting spikes in the parallel rate coded spike train during a predetermined time interval of approximately one hundred picoseconds. As envisioned for the present invention, each converter circuit is a 1-bit spiking A/D converter. The spikes are counted by a series of adders starting at 1-bit and increasing in size until the final 8-bit adder. Also, the size of the network is envisioned to include approximately two thousand converter circuits, with each A/D converter circuit being interconnected by feedback to approximately twenty neighboring converter circuits.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
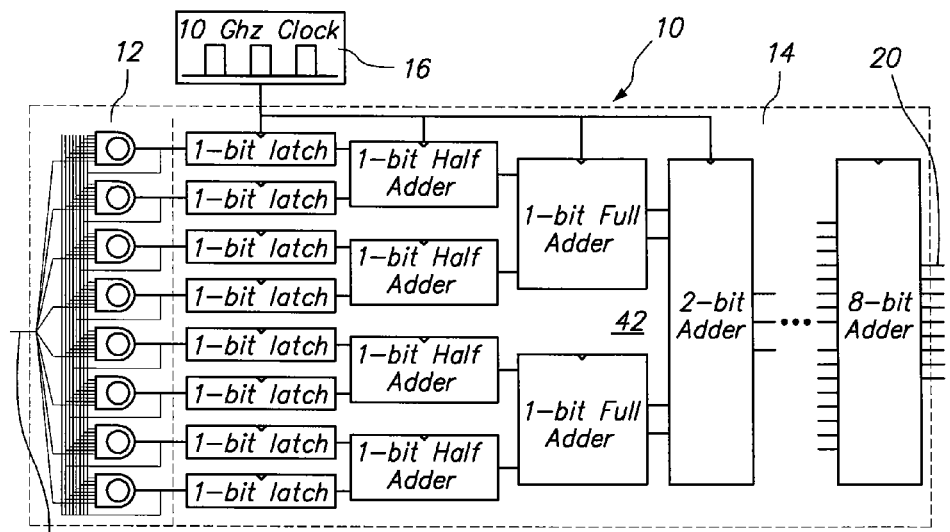
FIG. 1 is a schematic of a system for converting an analog signal into a digital data stream in accordance with the present invention.

Referring initially to FIG. 1, a system for converting an analog signal into a digital data stream is shown and is generally designated 10. As shown, the system 10 includes a recurrent network 12, a counter 14 and a clock 16. In more detail, the recurrent network 12 includes an input line 18 for receiving an input signal, and the outputs of the network 12 are electronically connected to the counter 14. The clock 16 is also electronically connected to the counter 14. For purposes of the present invention, the clock 16 is preferably a 10 GHz clock that is capable of sequentially establishing a series of predetermined time intervals that are each approximately one hundred picoseconds in duration. As shown, the counter 14 will have output line(s) 20 that are connected to a conventional data signal processor (not shown) and that, collectively, generate a digital data stream.

Figure 2:
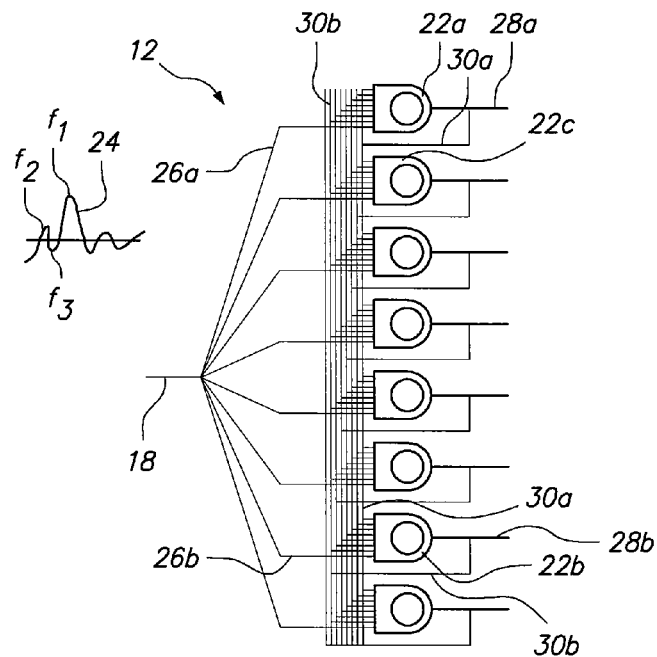
FIG. 2 is a schematic of a portion of a recurrent network as used in the system of the present invention.

The structural details of the recurrent network 12 will be best appreciated with reference to FIG. 2. With reference to FIG. 2 it is to be appreciated that the recurrent network 12 will include a very large number of converter circuits 22. Although only eight converter circuits 22 are shown, as envisioned for the present invention the system 12 will include approximately two thousand (or more) substantially identical converter circuits 22. With this in mind, and in order to simplify this disclosure, the initial reference here will be made to only the converter circuits 22a and 22b.

As shown (and implied) in FIG. 2, the converter circuits 22 of the system 10 have a common input. Thus, a single analog signal 24 on the input line 18 will be sent to all converter circuits 22. For instance, the signal 24 will be sent via an extension of the input line (i.e. input line 26a) to the converter circuit 22a. Similarly, the same analog signal 24 will be sent via input line 26b to the converter circuit 22b. Upon receiving the analog signal 24, the converter circuits 22a and 22b convert the signal 24 into spike outputs. These spike outputs are then sent to the counter 14 via respective output lines 28a and 28b. FIG. 2 also indicates that each converter circuit 22 has a feedback line 30 that provides for feedback to the converter circuit 22, itself, as well as to a plurality of neighboring converter circuits 22. For example, the feedback line 30a from converter circuit 22a goes to converter circuit 22a, and to other converter circuits 22 (e.g. converter circuit 22b). Likewise, the feedback line 30b from converter circuit 22b goes to converter circuit 22b, and to other converter circuits 22 (e.g. converter circuit 22a). As envisioned for the system 10 of the present invention, each converter circuit 22 can be interconnected with feedback loops to as many as twenty, or more, other converter circuits 22.

Figure 3:
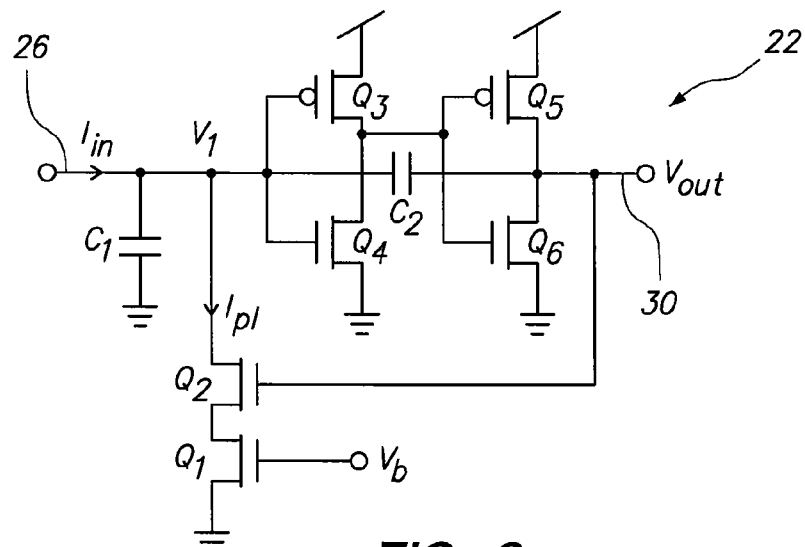
FIG. 3 is a circuit diagram of a converter circuit for use in the system of the present invention.

In FIG. 3, a schematic for the preferred architecture of a converter circuit 22 is shown to include six transistors (labeled Q1, Q2, Q3, Q4, O5 and Q6, respectively). Preferably, these transistors are Metal-Oxide Semi-conductor, Field-Effect Transistors (MOSFETs) of a type well known in the pertinent art. FIG. 3 also indicates that the converter circuit 22 includes two capacitors (labeled C1 and C2). Importantly, the capacitor C1 is selected to provide an input time constant ($T_{input}$) for the firing rate of the converter circuit 22. On the other hand, the capacitor C2 is selected to establish a decay time constant ($T_{decay}$) for the converter circuit 22. Importantly, the time provided by $T_{decay}$ needs to be sufficiently long to allow for self-organization of the recurrent network 12. As envisioned for the present invention, $T_{input}$ will produce a firing rate that is ten times faster than the desired firing rate, and $T_{decay}$ will be approximately five hundred times greater than $T_{input}$.

Figure 4:
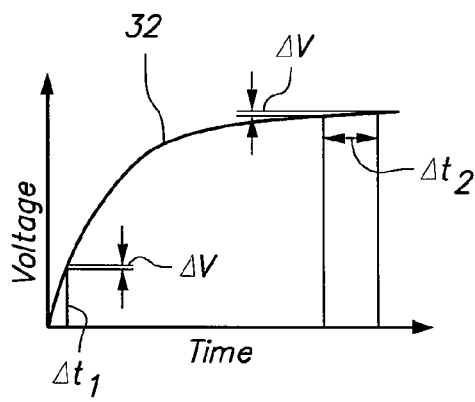
FIG. 4 is a graph showing the effect of feed back on the charge fire cycle of a converter circuit.

FIG. 4 gives an indication of how the converter circuits 22 in the recurrent network 12 of system 10 are able to self-organize. As generally indicated above, this self-organization is accomplished by interconnecting the converter circuits 22 to each other through feedback lines 30. Specifically, feedback pulses, in the form of voltage decrements (Δv), are sent from each converter circuit 22 to a plurality of neighboring converter circuits 22. For example, consider the converter circuits 22a, 22b and 22c shown in FIG. 2. In this case, as the converter circuit 22a fires, the voltage decrement Δv will be fed back as input to the converter circuits 22b and 22c. As an input to the converter circuits 22b and 22c, this voltage decrement Δv will be respectively subtracted from the charging voltage of converter circuits 22b and 22c. Depending on the position of the particular converter circuit 22b or 22c on its charge curve 32, the converter circuits 22b and 22c will experience different time setbacks. As shown in FIG. 4, it could well happen that the converter circuit 22c will experience a time setback of $\Delta t_1$ in response to the voltage decrement Δv, while the converter circuit 22b will experience a time setback of $\Delta t_2$ in response to the same Δv. As intended for the system 10, this same circumstance extends to all interconnected neighboring converter circuits 22. The consequence is that the spike outputs of all converter circuits 22 in the system 10 will queue in a manner that promotes self-organization of the recurrent network 12. Stated differently, the spike outputs of the various converter circuits 22 will be organized so they do not interfere or overlap each other. Consequently, the spike outputs of all converter circuits 22 are potentially available for being counted by the counter 14.

Figure 5:
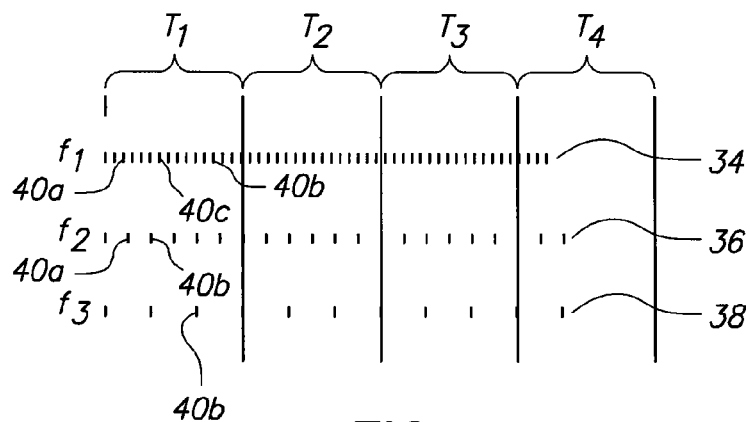
FIG. 5 is a representation of spike rate outputs from a converter circuit depending on the voltage value of an analog input.

With the above in mind, FIG. 5 illustrates the effect that the input of an analog signal 24 will have on the converter circuits 22 in a recurrent network 12. Specifically, FIG. 5 shows that for a relatively high voltage value ($f_1$), corresponding to the magnitude of the analog signal 24 (see FIG. 2) a parallel rate coded spike train 34 results. For a lower voltage value ($f_2$) in the analog signal 24, a different parallel rate coded spike train 36 results. And, for a still lower voltage value ($f_3$), the result is the parallel rate coded spike train 38. The consequence is that within a time interval $T_1$, depending on which of the trains 34, 36 and 38 is generated, more or fewer converter circuits 22 in the recurrent network 12 will fire and provide a spike output. For example, FIG. 5 indicates that for the rate coded spike train 34, all three of the converter circuits 22a, b and c may fire in the time interval $T_1$ and, respectively, produce spike outputs 40a, 40b and 40c. On the other hand, when the relatively lower voltage value $f_2$ is received from the analog signal 24, and the spike train 36 is generated, the firing rate of the converter circuits 22 is slower. In this case, not so many converter circuits 22 will fire within the time interval $T_1$. To illustrate this point, of the counters 22a, 22b and 22c, only converter circuits 22a and 22b are shown to produce spike outputs 40a and 40b in the spike train 36 during the time interval $T_1$. Further, it may happen for the still lower voltage value $f_3$ (spike train 38) that only the converter circuit 22b will generate a spike output 40b during the time interval $T_1$.

It is also to be appreciated that in order to represent a complete analog signal 24, having both positive (+) and negative (−) values, an intermediate parallel spike train (e.g. the rate coded spike train 36 that results for $f_2$; see FIG. 2) can be established to represent a zero voltage value. Thus, $f_1$ would be a positive (+), and $f_3$ would be a negative (−). In these examples, the clock 16 sets the duration of the time intervals, $T_{1-4}$, and, preferably it is about one hundred picoseconds. FIG. 5 also indicates that the time intervals are substantially equal (i.e. $T_1=T_2=T_3 \ldots$), and are sequentially repeated in order to count spike outputs in the rate coded spike trains that are generated during consecutive time intervals. As envisioned for the present invention, a cascade of adders (generally designated 42 in FIG. 1) is used to count the spike outputs 40 from converter circuits 22 during a time interval T. The adders in cascade 42 are initially 1-bit half adders with their output received by a column of 1-bit full adders. The output of that column of adders is received by a column of 2-bit adders, etc. until the final 8-bit adder is reached.

For an overview of the operation of the system 10, refer back to FIG. 1. To begin, it will be appreciated that an analog signal 24 can be input to the recurrent network 12 over the input line 18. Thus the analog signal 24 is fed, in parallel, to the plurality of converter circuits 22 (e.g. 2000 circuits) in the recurrent network 12. As the signal 24 is being received, the voltage value of the signal 24 initiates a charge fire cycle in each converter circuit 22 that results in a spike output (e.g. spike output 40 for converter circuit 22a). Recall that depending on the magnitude of the analog signal 24, the rate at which spike outputs are generated will vary. In each case, however, a voltage decrement Δv from the spike output of the converter circuit 22 is fed back via feedback lines 30 to a plurality of neighboring converter circuits 22. This voltage decrement Δv is then subtracted from the respective input.

As illustrated in FIG. 4, the voltage decrement Δv that is fed back over feedback lines 30 causes an adjustment in the charge curve 32 of the respective converter circuits 22. In turn, this adjustment causes the spike outputs of the converter circuits 22 to queue (i.e. self-organize). The collective consequence of this is the creation of a parallel rate coded spike train. For example, for a voltage value (signal magnitude) of $f_1$ in the analog signal 24, the rate coded spike train 34 is generated. When the analog signal 24 changes from $f_1$, corresponding spike trains will be generated (e.g.

rate coded spike trains 36 and 38). As this occurs, the counter 14 will count spike outputs from the converter circuits 22 during a sequence of predetermined time intervals (T). As indicated above, the spike count during a particular time interval (e.g. $T_1$) is proportional to the magnitude of the analog signal 24 (e.g. $f_1$) during the time interval. It follows that as the rate coded spike trains change, due to changes in the magnitude of the analog signal 24, so too will the spike count during the predetermined time interval (T). The overall result is the generation of a digital data stream.

While the particular Analog to Digital Conversion Using Recurrent Neural Networks as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A system for converting an analog signal into a digital data stream which comprises:
    a plurality of converter circuits arranged to individually receive the analog signal as a same analog input, and to generate a respective plurality of spike outputs that collectively create a parallel rate coded spike train, with the spike train exhibiting characteristics indicative of the analog input;
    a plurality of interconnecting feedback loops for each spike output, wherein a plurality of feedback pulses from the spike output is respectively sent over the plurality of feedback loops as inputs to a plurality of neighboring converter circuits to establish a recurrent network having coordinated charge-fire cycles; and
    a plurality of adders, with each adder connected to the output of a converter circuit in the network to convert the parallel rate coded spike train into the digital data stream.

2. A system as recited in claim 1 further comprising a 10 GHz digital clock for incrementally sampling the outputs of the plurality of converter circuits during a predetermined time interval to format the digital outputs for input to the plurality of adders.

3. A system as recited in claim 2 wherein conversion from the parallel rate coded spike train into the digital data stream is accomplished by counting spikes in the parallel rate coded spike train, and wherein the predetermined time interval is one hundred picoseconds.

4. A system as recited in claim 1 wherein each converter circuit is a 1-bit spiking A/D converter, and each adder is a 1-bit adder.

5. A system as recited in claim 4 wherein each converter circuit has an input time constant ($T_{input}$) to produce a firing rate, a decay time constant ($T_{decay}$) for promoting self-organization of the recurrent network, and an adjustable voltage decrement in its feedback pulse ($\Delta v$) to establish a desired firing rate for converter circuits in the network.

6. A system as recited in claim 5 wherein $T_{input}$ is selected to produce a firing rate that is ten times faster than the desired firing rate, and $T_{decay}$ is approximately five hundred times greater than $T_{input}$.

7. A system as recited in claim 6 wherein $\Delta v$ is adjusted depending on the number of interconnecting feedback loops and the size of the recurrent network to produce the desired firing rate.

8. A system as recited in claim 7 wherein the size of the network is approximately two thousand converter circuits, and wherein each converter circuit is interconnected by feedback to approximately twenty neighboring converter circuits.

9. A system for converting an analog signal into a digital data stream which comprises:
    a recurrent network for receiving an analog input signal wherein the recurrent network includes a plurality of converter circuits arranged to individually receive the analog signal as a same analog input, and for generating a plurality of spike outputs therefrom, wherein the plurality of spike outputs exhibit characteristics of the analog signal and collectively create a parallel rate coded spike train;
    a means for queuing the plurality of spike outputs; and
    a means for counting the spike outputs during a predetermined time interval to create the digital data stream.

10. A system as recited in claim 9 wherein the queuing means includes a plurality of interconnecting feedback loops for each spike output, wherein a plurality of feedback pulses from the spike output is respectively sent over the plurality of feedback loops as inputs to a plurality of neighboring converter circuits to coordinate charge-fire cycles for the recurrent network.

11. A system as recited in claim 10 wherein the counting means comprises:
    a plurality of adders, with each adder connected to the output of a converter circuit in the network to convert the parallel rate coded spike train into the digital data stream; and
    a 10 GHz digital clock for incrementally sampling the outputs of the plurality of converter circuits during a predetermined time interval to format the digital outputs for input to the plurality of adders.

12. A system as recited in claim 11 wherein each converter circuit is a 1-bit spiking A/D converter for generating output spikes, and wherein the system further comprises a series of adders for counting the output spikes in parallel.

13. A system as recited in claim 12 wherein each converter circuit has an input time constant ($T_{input}$) to produce a firing rate, a decay time constant ($T_{decay}$) for promoting self organization of the recurrent network, and an adjustable voltage decrement in its feedback pulse ($\Delta v$) to establish a desired firing rate for converter circuits in the network.

14. A system as recited in claim 13 wherein $T_{input}$ is selected to produce a firing rate that is ten times faster than the desired firing rate, and $T_{decay}$ is approximately five hundred times greater than $T_{input}$.

15. A system as recited in claim 14 wherein $\Delta v$ is adjusted depending on the number of interconnecting feedback loops and the size of the recurrent network to produce the desired firing rate.

16. A method for converting an analog signal into a digital data stream which comprises the steps of:
    receiving an analog input signal;
    generating a plurality of spike outputs from the input signal, wherein the spike outputs exhibit characteristics of the analog signal and wherein the generating step is accomplished using a plurality of converter circuits and a plurality of interconnecting feedback loops for each spike output;
    queuing the plurality of spike outputs, wherein the queuing step is accomplished by sending the plurality of interconnecting feedback pulses from the spike output of each converter circuit over the plurality of feedback loops as inputs to a respective plurality of neighboring converter circuits to establish a recurrent network having coordinated charge-fire cycles; and counting the spike outputs during a predetermined time interval to create the digital data stream.

17. A method as recited in claim 16 wherein the counting step comprises the steps of:

using a plurality of adders, with each adder connected to the output of a converter circuit in the network; and incrementally sampling the outputs of the plurality of converter circuits during a predetermined time interval to format the digital outputs for input to the plurality of adders.

18. A method as recited in claim 17 wherein each converter circuit has an input time constant ($T_{input}$) to produce a firing rate, a decay time constant ($T_{decay}$) for promoting self organization of the recurrent network, and an adjustable voltage decrement in its feedback pulse ($\Delta v$) to establish a desired firing rate for converter circuits in the network, and wherein the method further comprises the steps of:

selecting $T_{input}$ to produce a firing rate that is ten times faster than the desired firing rate, with $T_{decay}$ being approximately five hundred times greater than $T_{input}$; and adjusting $\Delta v$ to produce the desired output firing rate.

* * * * *